(12) United States Patent
Laing

(10) Patent No.: US 7,653,886 B2
(45) Date of Patent: Jan. 26, 2010

(54) CROSSLINKING OF NETLISTS

(76) Inventor: Mark Laing, 2599 Ginny Way, Lafayette, CO (US) 80026

( * ) Notice: Subject to any disclaimer, the term of this patent is extended or adjusted under 35 U.S.C. 154(b) by 182 days.

(21) Appl. No.: 11/840,122

(22) Filed: Aug. 16, 2007

(65) Prior Publication Data
US 2008/0288907 A1    Nov. 20, 2008

Related U.S. Application Data

(60) Provisional application No. 60/938,364, filed on May 16, 2007.

(51) Int. Cl.
*G06F 17/50*    (2006.01)
(52) U.S. Cl. ............................................. 716/3; 716/12
(58) Field of Classification Search ........................ None
See application file for complete search history.

(56) References Cited
U.S. PATENT DOCUMENTS 7,240,316 B2 *   7/2007   Regnier ........................ 716/11
7,272,812 B2 *   9/2007   Ishiyama ...................... 716/11
2003/0139842 A1   7/2003   Regnier
2003/0208721 A1   11/2003  Regnier
2003/0220920 A1   11/2003  Lake et al.

* cited by examiner

*Primary Examiner*—Leigh Marie Garbowski
(74) *Attorney, Agent, or Firm*—Trellis IP Law Group, PC

(57) ABSTRACT

In one embodiment, a method for determining crosslinking between netlists is provided. The first netlist and second netlist may have nets that have different net names but may be the same net. It is also possible that the content of individual nets in one list may need to be split or combined to accurately match the other list. Complete results will not be obtained if only 1 to 1 content matches are considered. The method determines an exploded list of one of the netlists, such as the second netlist, where the netlist is reversed such that the pins of the netlist are used as keys to an associated net name. A pin in the first netlist is then determined. The pin may be associated with a first net name in the first netlist. The pin is looked up in the exploded list using it as a key to determine a second net name for the pin. The process continues using each pin in the first netlist to determine the net name associated with the pin in the second netlist. When this process is finished, crosslinks between net names that match across netlists are determined.

20 Claims, 4 Drawing Sheets

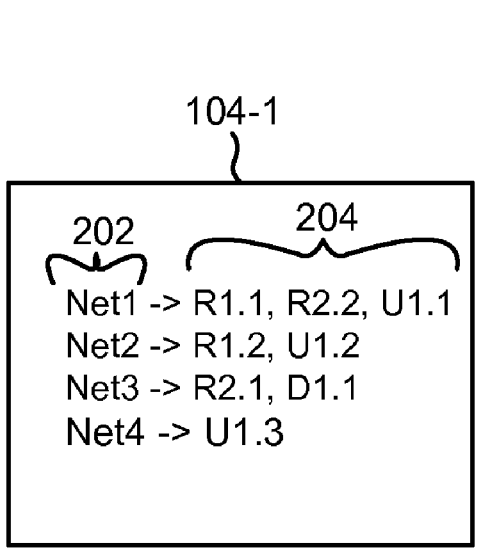
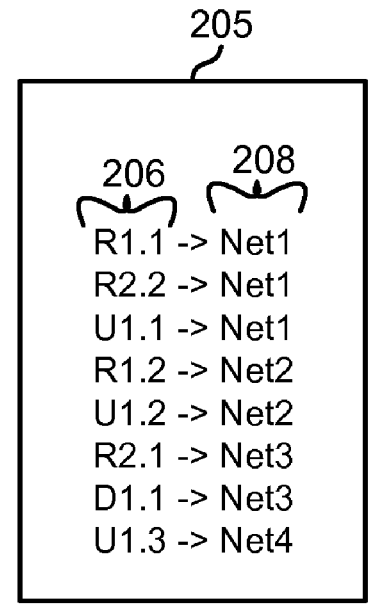
Fig. 2A              Fig. 2B
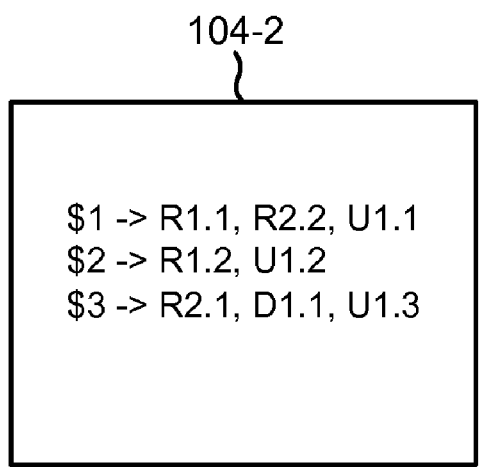
Fig. 3

CROSSLINKING OF NETLISTS

CROSS REFERENCES TO RELATED APPLICATIONS

This application claims priority from U.S. Provisional Patent Application Ser. No. 60/938,364, entitled CROSSLINKING OF NETLISTS, filed on May 16, 2007, which is hereby incorporated by reference as if set forth in full in this application for all purposes.

BACKGROUND

Particular embodiments generally relate to electronic design automation.

A netlist may describe the connectivity of an electronic design, such as an integrated circuit design. The netlist describes nets, which may be wires that connect components together in the electronic design. For example, a netlist may include a net name, such as net #1, that connects a pin of a resistor to a pin of a capacitor.

There may be multiple netlists for different stages of the electronic design. For example, the logical or schematic of an electronic design may be associated with a first netlist and the physical or layout of an electronic design may be associated with a second netlist. The net names in the different netlists may be different, but may refer to the same net. This may happen when different tools used in the design process assign different net names to the same nets. When a user is performing a design check on one of the electronic designs, such as a schematic design, it may be desirable to check the same net as it appears in the physical design or layout. However, because different net names may be used, the corresponding net name may not appear in the physical design thus making the check difficult.

SUMMARY

In one embodiment, a method for determining crosslinking between netlists is provided. Crosslinking is the result of intelligently matching two separate netlists so that component names, pins and net names can be associated with each other. A first netlist may be associated with a first stage of an electronic design, such as a logical or a schematic design, and a second netlist may be associated with a second stage of an electronic design, such as a physical or a layout design.

The first netlist and second netlist may have nets that have different net names but may be the same net. The method determines an exploded list of one of the netlists, such as the second netlist, where the netlist is reversed such that the pins of the netlist are used as keys to an associated net name. This is reversed from a format where each net name is listed in the netlist with all the associated pins that are connected by the net. A pin in the first netlist is then determined. The pin may be associated with a first net name in the first netlist. The pin is looked up in the exploded list using it as a key to determine a second net name for the pin. The process continues using each pin in the first netlist to determine the net name associated with the pin in the second netlist. When this process is finished, crosslinks between net names that match across netlists are determined. For example, a net name of Net1 may connect the pins R1.1 and U1.1 and a net name of $1 may connect the same pins. The method may determine that the net names Net1 and $1 correspond to the same net and should be crosslinked. The method to determine the crosslinking will be described in more detail below.

A further understanding of the nature and the advantages of particular embodiments disclosed herein may be realized by reference of the remaining portions of the specification and the attached drawings.

BRIEF DESCRIPTION OF THE DRAWINGS

FIG. 2A shows an example of a netlist according to one embodiment.

FIG. 2B shows an exploded netlist that has been reversed and flattened into a flat design.

FIG. 3 shows an example of a netlist according to one embodiment.

DETAILED DESCRIPTION OF EXAMPLE EMBODIMENTS

Figure 1:
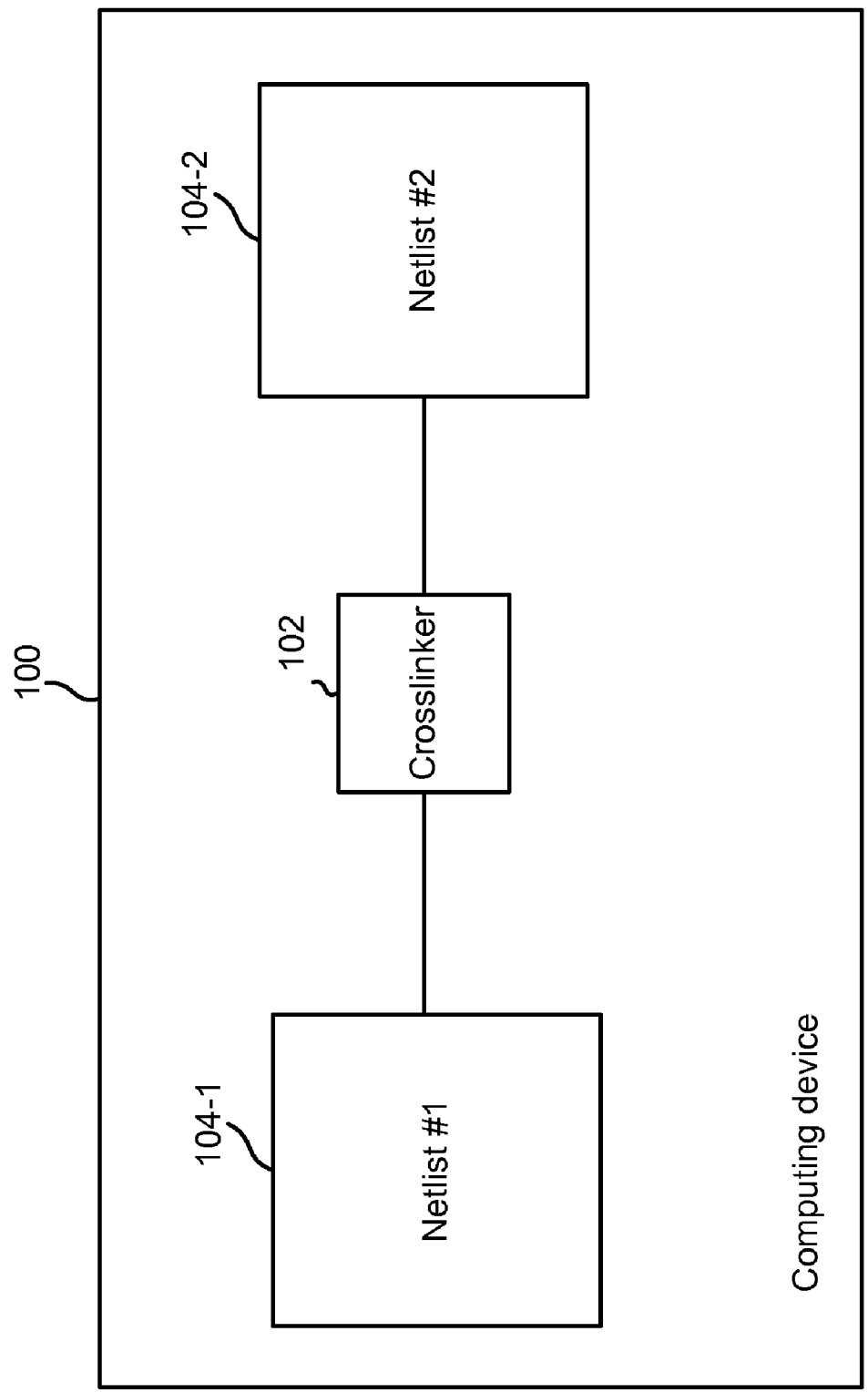
FIG. 1 shows an example of a computing device according to one embodiment.

FIG. 1 shows an example of a computing device 100 according to one embodiment. Computing device 100 includes a crosslinker 102 that is configured to crosslink a first netlist 104-1 and a second netlist 104-2. Although two netlists are crosslinked, it will be understood that more than two netlists may be crosslinked. Computing device 100 may be any suitable computing device, such as a personal computer, laptop, workstation, etc. Although netlist files are shown on the same computing device, they could be located on different computing devices and accessed from using crosslinker 102, which could also be on a different computing device.

Netlists 104 may be in a format that describes an electronic design, such as an integrated circuit design. Netlists 104 convey connectivity information about components in the electronic design. The components may be any components in an electronic design, such as resistors, capacitors, diodes, etc. The components may be connected through a connector that is referred to as a net. The net may be a wire or other connector that connects components together in a circuit. The components may have ports or pins, which are connection points. For example, a resistor may have two pins, which describe the two connections that may be connected to a resistor.

Netlists 104 may provide net names for nets in a first format. The first format lists the net names for nets and points to the pins that are connected to the net. For example, FIG. 2A shows an example of a netlist 104 according to one embodiment. As shown, a net name 202 is provided and includes the net names Net1, Net2, Net3. Pins for components are also listed in pin column 204. A "pin" when described with respect to a net name refers to a component reference designator and a pin number. For example, when a pin is referred to, such as pin R1.1, the component reference designator is a name for a component, such as "R1", and the pin is a first pin, pin "1". A component "R1" also includes a second pin, pin "2", and is labeled as R1.2. Accordingly, the component R1 has a pin1 connected to Net1 and a pin2 connected to Net2. Also, Net1 is a net name for a net that connects R1.1, R2.2, and U1.1. This means a wire may be connecting the pins for the listed components. There are numerous formats for the component/pin reference. For example, R1_1, R1-1, etc. may be used.

The netlist shown in FIG. 2A may be converted to a second format. For example, FIG. 2B shows an exploded netlist 205 that has been reversed and flattened into a new structure of the existing data. As shown, a pin column 206 shows the pins for components and a net name column 208 shows the net names. In this case, the netlist may be stored in a table, such as a hash table, where each individual pin is used as a key to a corresponding net for that pin. As shown, pin R1.1 corresponds to net name Net1. Further, pin R1.2 corresponds to net name Net2. Thus, there is a one-to-one relationship between pin and net name. Other formats may be used as long as the pin is used as the key to a net name in a one to one relationship. This is in contrast to the format of FIG. 2A, in which the net names correspond to the pins that were connected by the net. For example, the netlist in FIG. 2A uses the net names as keys to corresponding pins that are connected by the net.

FIG. 3 shows an example of a netlist for netlist 104-2 according to one embodiment. As shown, the net names are "$1", "$2", and "$3". The pins associated with net name $1 include R1.1, R2.2, and U1.1. A net $2 connects R1.2 and U1.2 and net $3, connects R2.1, D1.1, U1.3. As shown, the net names in netlist 104-2 are different from the net names in netlist 104-1. Thus, a component R1 is connected to net name $1 at pin 1 and net name $2 at pin 2.

Although the net names are different in the two netlists, this does not mean that the nets are different. For example, in the design process, when converting a schematic design to a layout, the tools used may have changed the net names in the design. It is also possible that nets in the schematic design may be split or combined with other nets when converting to the layout. Thus, there is not necessarily a 1 to 1 match based on the content of the nets. Some nets may need to be split up to match with its associated net and others may need to be combined to achieve the correct association. Accordingly, simple 1-1 net content matching may fall short of complete content netlist matching. Particular embodiments are able to support matching when a 1 to 1 match is not found, as will be described below.

Thus, crosslinker 102 is configured to determine crosslinks between net names in netlist 104-1 and netlist 104-2. Crosslinker 102 determines which net names in netlist 104-1 correspond to net names in netlist 104-2. When a crosslink is determined, logic may be stored in which automatic crosslinking may be provided. This allows a user to determine which nets in one design correspond to nets in another design. For example, a user may select a net name in a schematic drawing and be shown a crosslinked net name in the layout, even though the net names are different in the two data sets.

Figure 4:
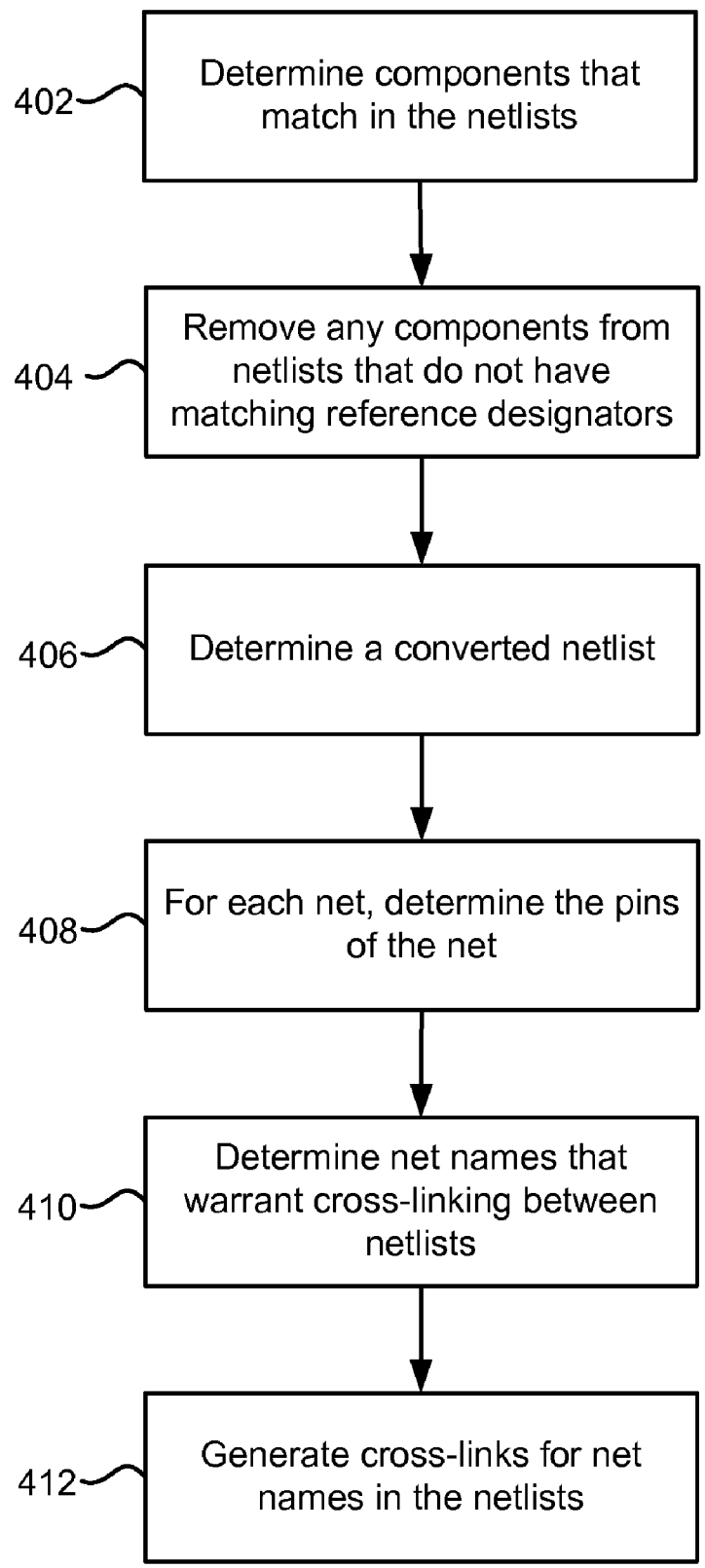
FIG. 4 depicts an example of a method for determining crosslinking according to one embodiment.

FIG. 4 depicts an example of a method for determining crosslinking according to one embodiment. The method may use one or more of the following assumptions. One assumption is that a component reference designator in both netlists 104-1 and 104-2 is the same component. For example, R1 in netlist 104-1 and R1 in netlist 104-2 are the same component but R1 and R2 are not the same component. There may be slight variations of names but a person skilled in the art would be able to tell that they are the same component reference designator. For example, the same component in one netlist may have an "A" and "B" added to the name, such as U100A and U100B may refer to U100. Other variations will be appreciated.

Also, multiple nets in netlist 104-1 may crosslink with one or more nets in netlist 104-2, and vice versa. In other words, a net may crosslink into multiple nets or multiple nets may crosslink into a single net. Thus, a one-to-one relationship in nets may or may not be found between netlists 104-1 and 104-2.

Another assumption is that net names may be unreliable features to use for crosslinking purposes. In other words, net names may change between netlist 104-1 and netlist 104-2.

One more assumption is that net names and reference designators are unique per file. That is, no duplicates exist. For example, the net name $1 does not occur multiple times in netlist 104-2. Although these assumptions are described, it will be understood that all of the assumptions may or may not be used and other assumptions may be appreciated.

In step 402, crosslinker 102 determines components that match in netlist 104-1 and netlist 104-2. For example, the reference designators are used to determine components that match one-to-one in netlist 104-1 and netlist 104-2. In one example, the component name R1 in netlist 104-1 is used to determine if a component name R1 is found in netlist 104-2. Additional parsing of component names may be needed to resolve components in which names match but may be slightly different. For example, component names may be listed on multiple sheets of a schematic may be different, such as U100A and U100B may refer to U100 or IC34-1 and IC34-2 may refer to IC34. The goal is to determine components that are found in both netlists 104-1 and 104-2.

In step 404, crosslinker 102 removes any components from netlists 104-1 and 104-2 that do not have matching reference designators. Although removal of the components is performed, it will be understood that these components do not need to be removed. However, if the components are not found in both netlists 104-1 and 104-2, then crosslinking between the components may not be possible. Thus, performing crosslinking for these components does not need to be performed and the list of components can be reduced.

In step 406, crosslinker 102 determines a converted netlist. For example, netlist 104-1 is reversed and flattened. In one example, the netlist shown in FIG. 2A is converted into exploded netlist 205 shown in FIG. 2B. Accordingly, the pins are used as a key for the corresponding net of the pin. The number of elements in the table may be the number of matching component pins in netlist 104-1.

In step 408, for each net, the pins of the net are determined. Each pin is used as a key or index to look up the corresponding net name in exploded netlist 205. This may be performed for each net in netlist 104-2.

In step 410, crosslinker 102 determines net names that warrant crosslinking between netlist 104-1 and netlist 104-2. A method of determining which net names to crosslink will be described in more detail below. Briefly, if matches for the number of pins for a net name in netlist 104-2 are found in exploded netlist 205, then a match of net names may be determined. For example, for the net name $1 in netlist 104-2, the component R1.1 is looked up in exploded netlist 205, which yields the net name Net1. Pins R2.2 and U1.1 are also looked up and yield the net name Net1. The net name Net1 has the three pins R1.1, R2.2, and U1.1 connected to it and thus threes matches are found. Accordingly, it may be determined that the net name $1 is crosslinked to the net name Net1. Also, for net name $3, R2.1 is looked up in exploded netlist 205 and yields Net3, D1.1 yields Net3, and U1.3 yields Net4. Thus, net name $3 is matched to Net3 and Net4. This is determined using three direct lookups. Accordingly, a net name that is split between two nets in another netlist can be easily determined using particular embodiments.

Step 412 then generates crosslinks for net names in netlists 104-1 and 104-2. For example, logic may be generated that may allow crosslinking between net names. A user may then be able to select a net name in netlist 104-1 and have it be crosslinked to a net name in netlist 104-2. For example, the crosslink may automatically output the crosslinked net name.

Also, if a schematic is being reviewed, the net name may be selected and then the corresponding net name in the layout may be looked up and displayed in the layout, and vice versa. Information for the crosslinking may then be stored.

Figure 5:
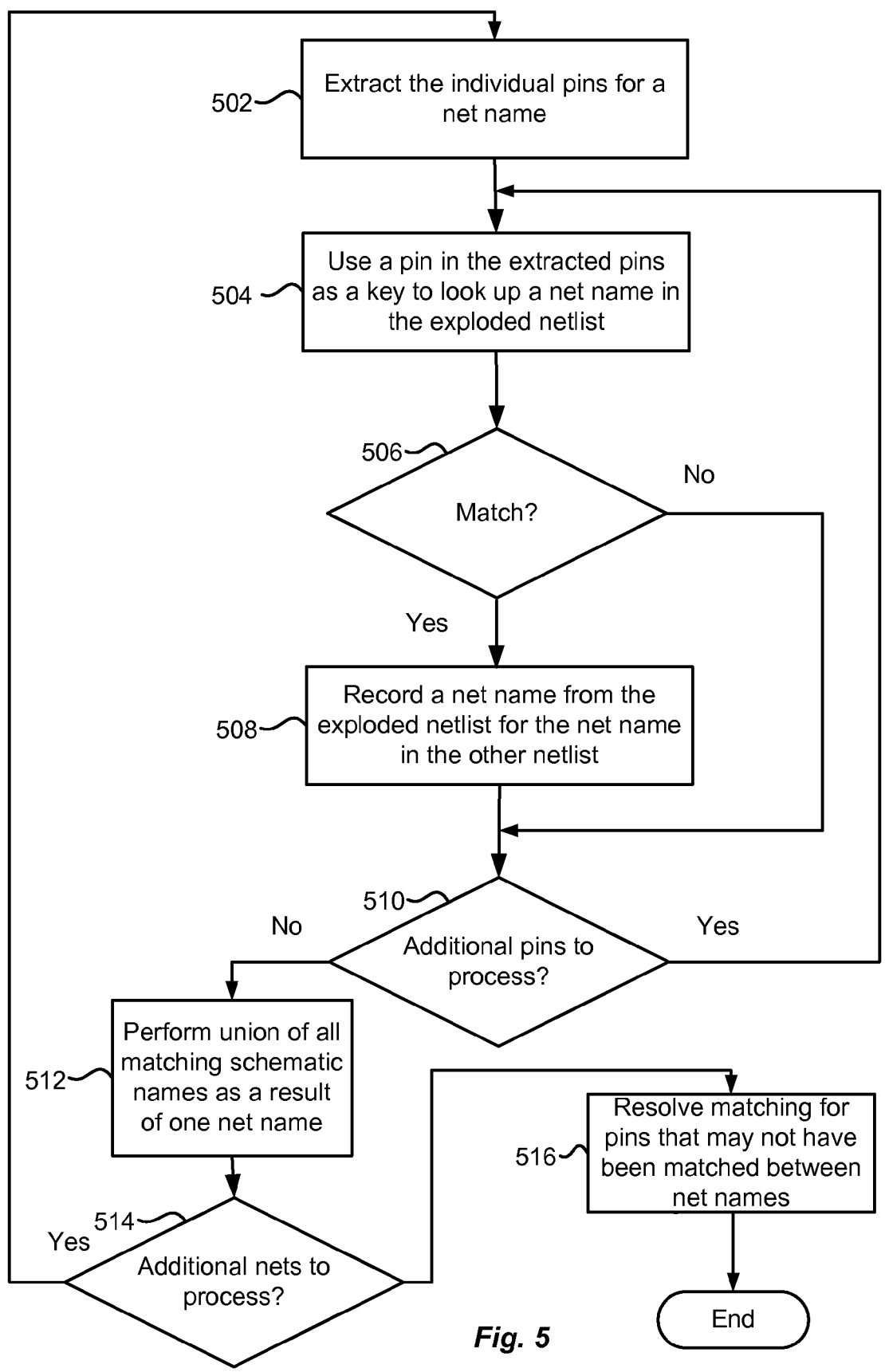
FIG. 5 depicts a more detailed example for performing the matching described in step 410 according to one embodiment.

FIG. 5 depicts a more detailed example for performing the matching described in step 410 according to one embodiment. In step 502, crosslinker 102 extracts the individual pins for a net name. For example, looking at netlist 104-2, for the net name $1, the pins R1.1, R2.2, and U1.1 are extracted.

In step 504, crosslinker 102 uses a pin in the extracted pins for a net name as a key to look up a net name in exploded netlist 205. For example, the pin R1.1 is used as a key in column 206 to determine the net name Net1 in column 208 in exploded netlist 205. This may be performed for each net name R1.1, R2.2, and U1.1. Referring to exploded netlist 205, this yields the net name of Net1 for all three pins.

In step 506, crosslinker 102 determines if there is a match. For example, if the pin lookup yields a number of net names equal to the number of pins, then a match may be determined. For example, the net name $1 has three pins associated with it. If three net names are found, then all pins for net name $1 have corresponding net names in exploded net list 205. A content match is thus determined. That is, the net name $1 can be crosslinked to one or more other net names. For example, each pin R1.1, R2.2, and U1.1 refer to the net name Net1 in exploded netlist 205.

If a match exists, in step 508, crosslinker 102 records a net name from exploded netlist 205 for the net name in netlist 104-2. However, if a match does not exist, the process proceeds to step 510 where it is determined if there are additional nets to process. If an initial match is not found, it may be possible to resolve the match later in the process. The initial match is when all the pins of a net do not index to a net name. For example, a pin U1.3 for net $3 may not reference a net in exploded netlist 205 and this is not considered an initial match. However, crosslinker 102 may determine that a match actually exists. This process is described in more detail in step 514.

Step 510 determines if additional pins for the net name need to be processed. The process may reiterate where steps 504-508 may be performed for all net names in netlist 104-2.

When all the pins for a net name have been processed, in step 512, a union of all matching schematic names as a result of one net name is performed. This provides the net names in net list 104-1 that crosslink to the net name in netlist 104-2.

Step 514 determines if there are any other nets to process in netlist 104-2. If so, the process reiterates to step 502 where the individual pins for another net name are extracted.

In step 516, crosslinker 102 resolves matching for pins that may not have been matched between net names. For example, an extra pin for a diode, U1.3 may not match a net name in the other netlist. In one embodiment, these net names may be ignored. In one example, it is known that a component match may exist between netlist 104-1 and netlist 104-2. Otherwise it would not have made it through the matching and removal in steps 402 and 404 in FIG. 4. For example, there is a component with the same reference designator of U1 in netlists 104-1 and 104-2. Thus, there is a high probability that if everything else on a net name in netlist 104-2 matched, then there may be a pin name mismatch, which may be common between a logical and physical electronic design. In one example, a schematic diode may have two pins, 1 and 2, but the physical component may be a diode with three pins. In this case, the two electrical pins may be 1 and 2 or A and K, and there also may be an extra pin for a no-connect (NC) in the layout. The extra pins may be ignored and a crosslink may be determined. Crosslinker 102 may include intelligence to determine which non-matches should be resolved to matches. For example, if an extra pin is a no-connect (NC), then crosslinker 102 may decide to ignore it and declare a match. However, if the extra pin is connected to another component, then crosslinker 102 may not determine a crosslink.

The above non-matches may be removed by crosslinker 102 and the match may be determined based on the remaining pins for the net name. For example, if a net name in exploded netlist 205 is not found for U1.1, but the net name Net1 for R1.1 and R2.2 is found as Net1, then a match for $1 may be determined as Net1 even though a net name has not been found for U1.1.

The result of the methods of FIG. 4 and FIG. 5 is a matching list of components, pins, and net names from netlist 104-1 and netlist 104-2. The different net names are crosslinked across the netlists. For example, the net names are crosslinked, such as Net1 is crosslinked to $1. Also, the pins are crosslinked, such as pin R1.1 crosslinks to R1.1 in both netlists 104-1 and 104-2.

Crosslinker 102 provides a quick and efficient method for crosslinking different net names in different netlists. This is because the pins are used as an index to determine the net name in exploded list 205. If the netlist shown in FIG. 2A is used, then multiple iterations may have to be performed to determine the net names. For example, for pin R1.1, the pins for Net1 may need to be parsed to determine if pin R1.1 is connected to Net1, which it is. Then, to find the corresponding net name for pin R1.2, the pins for Net1 may need to be parsed again. In this case, the pins for Net1 do not connect to pin R1.2. Thus, the pins for Net2 are parsed to determine that the net name for R1.2 is Net2. Then, for the pin U1.2, the pins for Net1 may need to be parsed again in addition to the pins for Net2. Thus, multiple iterations of parsing the pins for Net1 and Net2 need to be performed. When crosslinking a large number of nets, such as 5000 nets, this process becomes inefficient and tedious as a large number of nets are continuously parsed. By using pins as indexes into a table, a direct match may be performed efficiently without iteration. Thus, iterations of scanning the netlists multiple times do not need to be performed. The netlist may be accessed a minimum number of times required to determine the crosslink. For example, each pin may be accessed once in the exploded netlist 205 per pin in netlist 104-2.

Also, particular embodiments process an N-to-N net matching issue efficiently. For example, pins for $1 may point to multiple net names, such as Net1 and Net2. In this case, the net name $1 may have been broken into two nets in another design. Thus, a net corresponds to multiple nets. Particular embodiments allow an efficient determination of a crosslink in these situations. Because the index into exploded list 205 is used, the union is taken for multiple net names and a crosslink to multiple net names is determined. The union would crosslink $1 to Net1 and Net2. Because a 1 to 1 matching is performed by determining a corresponding net name for crosslinking, the N-to-N matching problem is simplified to an "N" number of 1 to 1 problems. Looking up the 1 to 1 match can be performed and then a union of the matches yields the N net names for the crosslink. If the format of original netlist 104-1 (not exploded netlist 205) was being used, then the crosslink in this situation may be computationally intensive because this is an N to 1 problem. The algorithm would have to figure out how N net names crosslink to another net name. This may involve multiple iterations through netlist 104-2.

Once the matching has been performed, crosslinking information may be added to netlists 104-1 and/or 104-2. Thus, when the netlists are accessed, the crosslink to the other netlist may be determined. For example, a designer performing a review for schematic data or layout data. When a net on the schematic is determined, the user may want to see the net on the layout. In this case, the user may select Net1 and using the crosslinking information, the net name $1 is determined in the layout and can be outputted to the user. Further, crosslinking of components may be performed.

Although the description has been described with respect to particular embodiments thereof, these particular embodiments are merely illustrative, and not restrictive. For example, lists other than netlists may be used.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing. Functions can be performed in hardware, software, or a combination of both. Unless otherwise stated, functions may also be performed manually, in whole or in part.

In the description herein, numerous specific details are provided, such as examples of components and/or methods, to provide a thorough understanding of particular embodiments. One skilled in the relevant art will recognize, however, that a particular embodiment can be practiced without one or more of the specific details, or with other apparatus, systems, assemblies, methods, components, materials, parts, and/or the like. In other instances, well-known structures, materials, or operations are not specifically shown or described in detail to avoid obscuring aspects of particular embodiments.

A "computer-readable medium" for purposes of particular embodiments may be any medium that can contain, store, communicate, propagate, or transport the program for use by or in connection with the instruction execution system, apparatus, system, or device. The computer readable medium can be, by way of example only but not by limitation, an electronic, magnetic, optical, electromagnetic, infrared, or semiconductor system, apparatus, system, device, propagation medium, or computer memory.

Particular embodiments can be implemented in the form of control logic in software or hardware or a combination of both. The control logic, when executed by one or more processors, may be operable to perform that what is described in particular embodiments.

A "processor" or "process" includes any human, hardware and/or software system, mechanism or component that processes data, signals, or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

Reference throughout this specification to "one embodiment", "an embodiment", "a specific embodiment", or "particular embodiment" means that a particular feature, structure, or characteristic described in connection with the particular embodiment is included in at least one embodiment and not necessarily in all particular embodiments. Thus, respective appearances of the phrases "in a particular embodiment", "in an embodiment", or "in a specific embodiment" in various places throughout this specification are not necessarily referring to the same embodiment. Furthermore, the particular features, structures, or characteristics of any specific embodiment may be combined in any suitable manner with one or more other particular embodiments. It is to be understood that other variations and modifications of the particular embodiments described and illustrated herein are possible in light of the teachings herein and are to be considered as part of the spirit and scope.

Particular embodiments may be implemented by using a programmed general purpose digital computer, by using application, specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated particular embodiments, including what is described in the Abstract, is not intended to be exhaustive or to limit the invention to the precise forms disclosed herein. While specific particular embodiments of, and examples for, the invention are described herein for illustrative purposes only, various equivalent modifications are possible within the spirit and scope , as those skilled in the relevant art will recognize and appreciate. As indicated, these modifications may be made to the present invention in light of the foregoing description of illustrated particular embodiments and are to be included within the spirit and scope.

Thus, while the present invention has been described herein with reference to particular embodiments thereof, a latitude of modification, various changes and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit. It is intended that the invention not be limited to the particular terms used in following claims and/or to the particular embodiment disclosed as the best mode contemplated for carrying out this invention, but that the invention will include any and all particular embodiments and equivalents falling within the scope of the appended claims.

I claim:

1. A method comprising:
   determining a first netlist and a second netlist;
   determining a list of the second netlist using each pin of the netlist as a key to a corresponding net for each pin;
   determining a pin in the first netlist, the pin associated with a first net name;
   by one or more computing devices, looking up the pin using the pin as a key in the list to determine a second net name for the pin; and
   by the one or more computing devices, determining if a crosslink exists between the first net name in the first netlist and the second net name in the second netlist.

2. The method of claim 1, wherein determining the list comprises flattening the second netlist to be a list where each pin is associated with the net in a one to one relationship.

3. The method of claim 2, wherein determining the list comprises reversing the second netlist such that the pins are keys in the second netlist instead of the nets.

4. The method of claim 1, wherein performing the determining the pin and looking up the pin is performed for each pin in the first netlist, wherein determining if the crosslink exists comprises determining, for each net in the first netlist, if the pins correspond to a net name in the list.

5. The method of claim 4, further comprising determining a crosslink for the first net name to one or more second net names in which the pins for the first net name correspond to in the list.

6. The method of claim 1, further comprising:
   parsing the first netlist and the second netlist to determine components that do not match in both the first netlist and the second netlist; and
   removing the non-matching components from the first and the second netlist.

7. The method of claim 1, wherein the first netlist is a logical netlist and the second netlist is a physical netlist.

8. The method of claim 1, wherein net names in the first netlist and the second netlist do not match in name but are crosslinked.

9. The method of claim 1, further comprising:
   storing the crosslink for the first netlist and the second netlist;
   receiving a selection of the first net name for the first netlist; and
   outputting, using the one or more computing devices, an indication the first net name is crosslinked with the second net name in the second net list.

10. A computer-readable storage medium including computer-executable software for execution by the one or more computer processors, the computer-executable software when executed operable to:
    determine a first netlist and a second netlist;
    determine a list of the second netlist using each pin of the netlist as a key to a corresponding net for each pin;
    determine a pin in the first netlist, the pin associated with a first net name;
    by the one or more computer processors, look up the pin using the pin as a key in the list to determine a second net name for the pin; and
    by the one or more computer processors, determine if a crosslink exists between the first net name in the first netlist and the second net name in the second netlist.

11. The computer-readable storage medium of claim 10, wherein the computer-executable software operable to determine the list comprises computer-executable software that, when executed, is operable to flatten the second netlist to be a list where each pin is associated with the net in a one to one relationship.

12. The computer-readable storage medium of claim 11, wherein the computer-executable software operable to determine the list comprises computer-executable software that, when executed, is operable to reverse the second netlist such that the pins are keys in the second netlist instead of the nets.

13. The computer-readable storage medium of claim 10, further comprising computer-executable software that, when executed, is operable to perform the determining the pin and looking up the pin for each pin in the first netlist, wherein the computer-executable software operable to determine if the crosslink exists comprises computer-executable software operable to determine, for each net in the first netlist, if the pins correspond to a net name in the list.

14. The computer-readable storage medium of claim 13, wherein the computer-executable software, when executed, is further operable to determine a crosslink for the first net name to one or more second net names in which the pins for the first net name correspond to in the list.

15. The computer-readable storage medium of claim 10, wherein the computer-executable software, when executed, is further operable to:
    parse the first netlist and the second netlist to determine components that do not match in both the first netlist and the second netlist; and
    remove the non-matching components from the first and the second netlist.

16. The computer-readable storage medium of claim 10, wherein the first netlist is a logical netlist and the second netlist is a physical netlist.

17. The computer-readable storage medium of claim 10, wherein net names in the first netlist and the second netlist do not match in name but are crosslinked.

18. The computer-readable storage medium of claim 10, computer-executable software, when executed, is further operable to:
    store the crosslink for the first netlist and the second netlist;
    receive a selection of the first net name for the first netlist; and
    output an indication the first net name is crosslinked with the second net name in the second net list.

19. An apparatus comprising:
    means for determining a first netlist and a second netlist;
    means for determining a list of the second netlist using each pin of the netlist as a key to a corresponding net for each pin;
    means for determining a pin in the first netlist, the pin associated with a first net name;
    means for looking up the pin using the pin as a key in the list to determine a second net name for the pin; and
    means for determining if a crosslink exists between the first net name in the first netlist and the second net name in the second netlist.

20. An apparatus comprising:

one or more computer processors;

computer-executable software encoded in one or more computer readable storage media for execution by the one or more computer processors and when executed operable to:

determine a first netlist and a second netlist;

determine a list of the second netlist using each pin of the netlist as a key to a corresponding net for each pin;

determine a pin in the first netlist, the pin associated with a first net name;

by the one or more computer processors, look up the pin using the pin as a key in the list to determine a second net name for the pin; and by the one or more computer processors, determine if a crosslink exists between the first net name in the first netlist and the second net name in the second netlist.

* * * * *